United States Patent
Loopstra et al.

(10) Patent No.: US 7,523,701 B2
(45) Date of Patent: Apr. 28, 2009

(54) IMPRINT LITHOGRAPHY METHOD AND APPARATUS

(75) Inventors: Erik Roelof Loopstra, Heeze (NL); Aleksey Yurievich Kolesnychenko, Helmond (NL); Helmar Van Santen, Amsterdam (NL)

(73) Assignee: ASML Netherlands B.V., Veldhoven (NL)

( * ) Notice: Subject to any disclaimer, the term of this patent is extended or adjusted under 35 U.S.C. 154(b) by 469 days.

(21) Appl. No.: 11/072,686

(22) Filed: Mar. 7, 2005

(65) Prior Publication Data

US 2006/0196377 A1 Sep. 7, 2006

(51) Int. Cl.
*B81C 5/00* (2006.01)
*B29C 59/02* (2006.01)

(52) U.S. Cl. .......................................... 101/9; 101/483
(58) Field of Classification Search ............... 101/9
See application file for complete search history.

(56) References Cited

U.S. PATENT DOCUMENTS

| | | | |
|---|---|---|---|
| 5,512,131 A | 4/1996 | Kumar et al. | 156/655.1 |
| 5,772,905 A | 6/1998 | Chou | 216/44 |
| 6,165,911 A | 12/2000 | Calveley | 438/754 |
| 6,309,580 B1 | 10/2001 | Chou | 264/338 |
| 6,334,960 B1 | 1/2002 | Willson et al. | 216/52 |
| 6,365,059 B1 | 4/2002 | Pechenik | 216/52 |
| 6,375,870 B1 | 4/2002 | Visovsky et al. | 264/1.31 |
| 6,482,742 B1 | 11/2002 | Chou | 438/690 |
| 6,518,189 B1 | 2/2003 | Chou | 438/706 |
| 6,656,341 B2 | 12/2003 | Petersson et al. | 205/667 |
| 6,696,220 B2 | 2/2004 | Bailey et al. | 430/272.1 |
| 6,719,915 B2 | 4/2004 | Willson et al. | 216/44 |
| 6,805,054 B1 * | 10/2004 | Meissl et al. | 101/483 |
| 6,921,615 B2 | 7/2005 | Sreenivasan et al. | 430/22 |
| 2002/0093122 A1 | 7/2002 | Choi et al. | 264/401 |
| 2002/0094496 A1 | 7/2002 | Choi et al. | 430/322 |
| 2002/0132482 A1 | 9/2002 | Chou | 438/692 |
| 2002/0167117 A1 | 11/2002 | Chou | 264/338 |
| 2002/0177319 A1 | 11/2002 | Chou | 438/690 |

(Continued)

FOREIGN PATENT DOCUMENTS

WO WO 01/79591 A1 10/2001

(Continued)

OTHER PUBLICATIONS

Heon Lee et al., Full Wafer Scale Near Zero Residual Nano-Imprinting Lithography Using UV Curable Monomer Solution, Microelectronic Engineering 77 (2005) pp. 42-47.

(Continued)

*Primary Examiner*—Leslie J. Evanisko
*Assistant Examiner*—Joshua D. Zimmerman
(74) *Attorney, Agent, or Firm*—Pillsbury Winthrop Shaw Pittman LLP

(57) ABSTRACT

An imprinting method is disclosed that involves, in an embodiment, redistributing a volume of imprintable medium in a flowable state over a target portion of a surface of a substrate into regions of differing volume corresponding to regions of differing pattern density of an imprint pattern of a template, contacting the medium while in the flowable state with the template to form the imprint pattern in the medium, subjecting the medium to conditions to change the medium into a substantially non-flowable state, and separating the template from the medium while in the substantially non-flowable state.

20 Claims, 7 Drawing Sheets

U.S. PATENT DOCUMENTS

| | | | |
|---|---|---|---|
| 2003/0034329 A1 | 2/2003 | Chou | 216/44 |
| 2003/0080471 A1 | 5/2003 | Chou | 264/338 |
| 2003/0080472 A1 | 5/2003 | Chou | 264/338 |
| 2003/0081193 A1 | 5/2003 | White et al. | 355/72 |
| 2003/0127580 A1 | 7/2003 | Ling et al. | 249/115 |
| 2003/0139042 A1 | 7/2003 | Heidari | 438/689 |
| 2003/0141291 A1 | 7/2003 | Heidari et al. | 219/460.1 |
| 2003/0159608 A1 | 8/2003 | Heidari | 101/494 |
| 2003/0170053 A1 | 9/2003 | Montelius et al. | 399/318 |
| 2003/0189273 A1 | 10/2003 | Olsson | 264/293 |
| 2004/0005444 A1 | 1/2004 | Heidari | 428/212 |
| 2004/0009673 A1 | 1/2004 | Sreenivasan et al. | 438/694 |
| 2004/0010341 A1 | 1/2004 | Watts et al. | |
| 2004/0021866 A1 | 2/2004 | Watts et al. | 356/401 |
| 2004/0022888 A1 | 2/2004 | Sreenivasan et al. | 425/174.4 |
| 2004/0036201 A1 | 2/2004 | Chou et al. | 264/402 |
| 2004/0046288 A1 | 3/2004 | Chou | 264/479 |
| 2004/0081798 A1 | 4/2004 | Lee et al. | 428/141 |
| 2004/0124566 A1 | 7/2004 | Sreenivasan et al. | 264/494 |
| 2004/0149367 A1 | 8/2004 | Olsson et al. | 156/64 |
| 2004/0169003 A1 | 9/2004 | Lee et al. | 216/4 |
| 2004/0192041 A1 | 9/2004 | Jeong et al. | 438/689 |
| 2004/0200411 A1 | 10/2004 | Willson et al. | 118/500 |
| 2004/0209470 A1 | 10/2004 | Bajorek | 438/689 |
| 2004/0219249 A1 | 11/2004 | Chung et al. | 425/385 |
| 2004/0219461 A1 | 11/2004 | Chung et al. | 430/311 |
| 2005/0039618 A1 | 2/2005 | Heidari et al. | 101/368 |
| 2005/0064054 A1 | 3/2005 | Kasumi | 425/112 |
| 2005/0098534 A1 | 5/2005 | Sreenivasan et al. | |
| 2005/0270312 A1 | 12/2005 | Lad et al. | |
| 2005/0276919 A1 | 12/2005 | Truskett et al. | |

FOREIGN PATENT DOCUMENTS

WO     WO 01/79592 A1     10/2001

OTHER PUBLICATIONS

Stephen Y. Chou, et al., "Nanoimprint Lithography", J. Vac. Sci. Technol. B 14(6), Nov./Dec. 1996, pp. 4129-4133.

* cited by examiner

Prior Art

Prior Art

Prior Art

IMPRINT LITHOGRAPHY METHOD AND APPARATUS

FIELD

The present invention relates to imprint lithography.

BACKGROUND

A lithographic apparatus is a machine that applies a desired pattern onto a target portion of a substrate. Lithographic apparatus are conventionally used, for example, in the manufacture of integrated circuits (ICs), flat panel displays and other devices involving fine structures.

It is desirable to reduce the size of features in a lithographic pattern because this allows for a greater density of features on a given substrate area. In photolithography, the increased resolution may be achieved by using radiation of shorter wavelength. However, there are problems associated with such reductions. Current systems are starting to adopt optical sources with wavelengths in the 193 nm regime but even at this level, diffraction limitations become a barrier. At lower wavelengths, the transparency of materials is poor. Optical lithography apparatus capable of enhanced resolutions require complex optics and rare materials and are consequently expensive.

An alternative for printing sub-100 nm features, known as imprint lithography, comprises transferring a pattern to a substrate by imprinting a pattern into an imprintable medium using a physical mould or template. The imprintable medium may be the substrate or a material coated on to a surface of the substrate. The imprintable medium may be functional or may be used as a "mask" to transfer a pattern to an underlying surface. The imprintable medium may, for instance, be provided as a resist deposited on a substrate, such as a semiconductor material, into which the pattern defined by the template is to be transferred. Imprint lithography is thus essentially a moulding process on a micrometer or nanometer scale in which the topography of a template defines the pattern created on a substrate. Patterns may be layered as with optical lithography processes so that, in principle, imprint lithography could be used for such applications as IC manufacture.

The resolution of imprint lithography is limited only by the resolution of the template fabrication process. For instance, imprint lithography may be used to produce features in the sub-50 nm range with significantly improved resolution and line edge roughness compared to that achievable with conventional optical lithography processes. In addition, imprint processes do not require expensive optics, advanced illumination sources or specialized resist materials typically required by optical lithography processes.

In certain applications of imprint lithography, the imprintable medium is applied to the substrate homogeneously in metered droplets or via a spin-coating process, and the template is subsequently stamped into the imprintable medium. The displacement of the imprintable medium by the features on the patterned face of the template defines the imprinted pattern. The time required to imprint the pattern is thus dependent not only upon the amount of imprintable medium displaced, but is also sensitive to the distance over which the imprintable medium is displaced. In a typical imprinting method, the imprintable medium is displaced a considerable distance across the substrate surface thus lengthening the overall imprinting time.

SUMMARY

According to an aspect of the present invention, there is provided an imprinting method, comprising:

redistributing a volume of imprintable medium in a flowable state over a target portion of a surface of a substrate into regions of differing volume corresponding to regions of differing pattern density of an imprint pattern of a template;

contacting the medium while in the flowable state with the template to form the imprint pattern in the medium;

subjecting the medium to conditions to change the medium into a substantially non-flowable state; and separating the template from the medium while in the substantially non-flowable state.

When the imprint pattern spacing varies, as is the case in many applications, it would be desirable for the thickness of the imprintable medium to vary locally to take into account the varying spacing. This may not be achievable using conventional imprintable medium application methods, thus the method according to the first aspect of the invention, provides way to distribute the imprintable medium over the substrate surface into regions of differing volume corresponding to regions of differing pattern density defined by the template. Thus, lower volumes of imprintable medium are displaced over shorter distances when the imprintable medium is imprinted with the template, possibly reducing imprinting times.

In an embodiment, the volume of imprintable medium is provided in a flowable state on the target portion of the surface of the substrate.

In an embodiment, the imprintable medium is redistributed by impressing an appropriately configured redistribution stamp into the medium immediately prior to contacting the medium with the template. Thus, a second stamp may be used to redistribute the imprintable medium ready for patterning using the template.

In an embodiment, the redistribution stamp is impressed into the imprintable medium with a greater force than the contact force between the template and the imprintable medium. The force with which the redistribution stamp is impressed into the medium may be similar to or greater than the force used in the imprinting the template into the medium in a conventional imprint lithography process employing a similar type of imprintable medium. As a result of the redistribution of the imprintable medium, the contact force required to imprint the pattern into the imprintable medium may be similar to or less than the force required in a conventional process employing a similar imprintable medium.

In an embodiment, the redistribution stamp is impressed into the imprintable medium in a direction which is substantially perpendicular to the substrate surface.

In an embodiment, the pattern density of regions of the redistribution stamp corresponds to the pattern density of regions of the imprint pattern, thus helping to ensure a high degree of redistribution of the imprintable medium ready for imprinting.

In an embodiment, the imprintable medium is redistributed by contacting the medium with the template and moving the template across the target portion in a direction which is substantially parallel to the substrate surface. This embodiment may be thought of as using the template to smear the medium across the surface of the substrate by dragging the template across the surface of the medium prior to imprinting the medium. It is envisaged that rather than using the template to redistribute the imprintable medium parallel to the substrate surface, in certain applications it may be appropriate to use these purposes a liquid supply structure used for immersion lithography.

According to another aspect of the present invention, there is provided an imprinting method, comprising:

providing a first volume of imprintable medium in a flowable state on a first target portion of a surface of a substrate;

contacting the medium while in the flowable state with a template defining an imprint pattern having regions of different pattern density to form the imprint pattern in the medium;

subjecting the medium to conditions to change the medium into a substantially non-flowable state;

separating the template from the medium while in the substantially non-flowable state;

providing a second volume of imprintable medium in a flowable state adjacent a second target portion of the surface of the substrate; and moving the template to the second target portion such that the template contacts and redistributes the second volume of imprintable medium over the second target portion of the substrate surface.

This aspect of the present invention utilizes the template not only to imprint the imprintable medium but also to redistribute the medium over the surface of the substrate prior to imprinting. This can reduce the amount of medium displaced and the distance over which the medium is displaced during imprinting thus possibly lowering imprinting times.

According to another aspect of the present invention, there is provided an imprint apparatus, comprising:

a substrate holder configured to hold a substrate having a volume of imprintable medium in a flowable state on a target portion of a surface of the substrate;

a template holder configured to hold a template defining an imprint pattern having regions of different pattern density and to cause the template to imprint the medium with the pattern while the medium is in a flowable state and to separate from the medium while the medium is in a substantially non-flowable state; and a redistribution device operable, prior to imprinting of the medium with the template, to redistribute the volume of medium over the target portion into regions of differing volume corresponding to the regions of different pattern density of the imprint pattern; and a conditioning apparatus configured to subject the medium to conditions to change the medium from the flowable state into the substantially non-flowable state.

In an embodiment, the redistribution device comprises a redistribution stamp. In an embodiment, the redistribution device is operable to impress the redistribution stamp into the imprintable medium in a direction which is substantially perpendicular to the substrate surface. So as to redistribute the imprintable medium as far as possible for patterning, in an embodiment, the pattern density of regions of the redistribution stamp corresponds to the pattern density of regions of the imprint pattern. In an embodiment, the redistribution device comprises the template. In an embodiment, the redistribution device is operable to cause the template to contact the imprintable medium and move the template across the target portion in a direction which is substantially parallel to the substrate surface.

According to another aspect of the present invention, there is provided an imprint apparatus, comprising:

a dosing apparatus configured to provide first and second volumes of an imprintable medium in a flowable state on respective adjacent first and second target portions of a surface of a substrate;

a template holder configured to hold a template defining an imprint pattern having regions of different pattern density, to cause the template to imprint the first volume of imprintable medium with the pattern while the first volume is in a flowable state, to cause the template to separate from the first volume while the first volume is in a substantially non-flowable state, and to cause the template, after imprinting of the first volume, to move to the second target portion such that the template contacts and redistributes the second volume of imprintable medium over the second target portion of the substrate surface; and a conditioning apparatus configured to subject the first and second volumes of medium to conditions to change the first and second volumes of medium from the flowable state into the substantially non-flowable state.

According to another aspect of the present invention, there is provided an imprint apparatus, comprising:

a substrate holder configured to hold a substrate having a volume of imprintable medium in a flowable state on a target portion of a surface of the substrate;

a template holder configured to hold a template defining an imprint pattern having regions of different pattern density, to cause the template to imprint the medium with the pattern while the medium is in the flowable state, and to cause the template to separate from the medium while the medium is in a substantially non-flowable state;

a smearing device configured to smear the imprintable medium beneath the template; and a conditioning apparatus configured to subject the medium to conditions to change the medium from the flowable state into the substantially non-flowable state.

With respect to all of the above aspects of the present invention, any desirable imprintable medium may be used, for example, UV curable resins, thermoplastic polymers and thermosetting polymers. The skilled person will be able to readily determine the appropriate conditions to change the imprintable medium from a flowable state to a substantially non-flowable state depending upon the nature of the imprintable medium used.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

There are two principal approaches to imprint lithography which will be termed generally as hot imprint lithography and UV imprint lithography. There is also a third type of "printing" lithography known as soft lithography. Examples of these are illustrated in FIG. 1a to 1c.

Figure 1A:
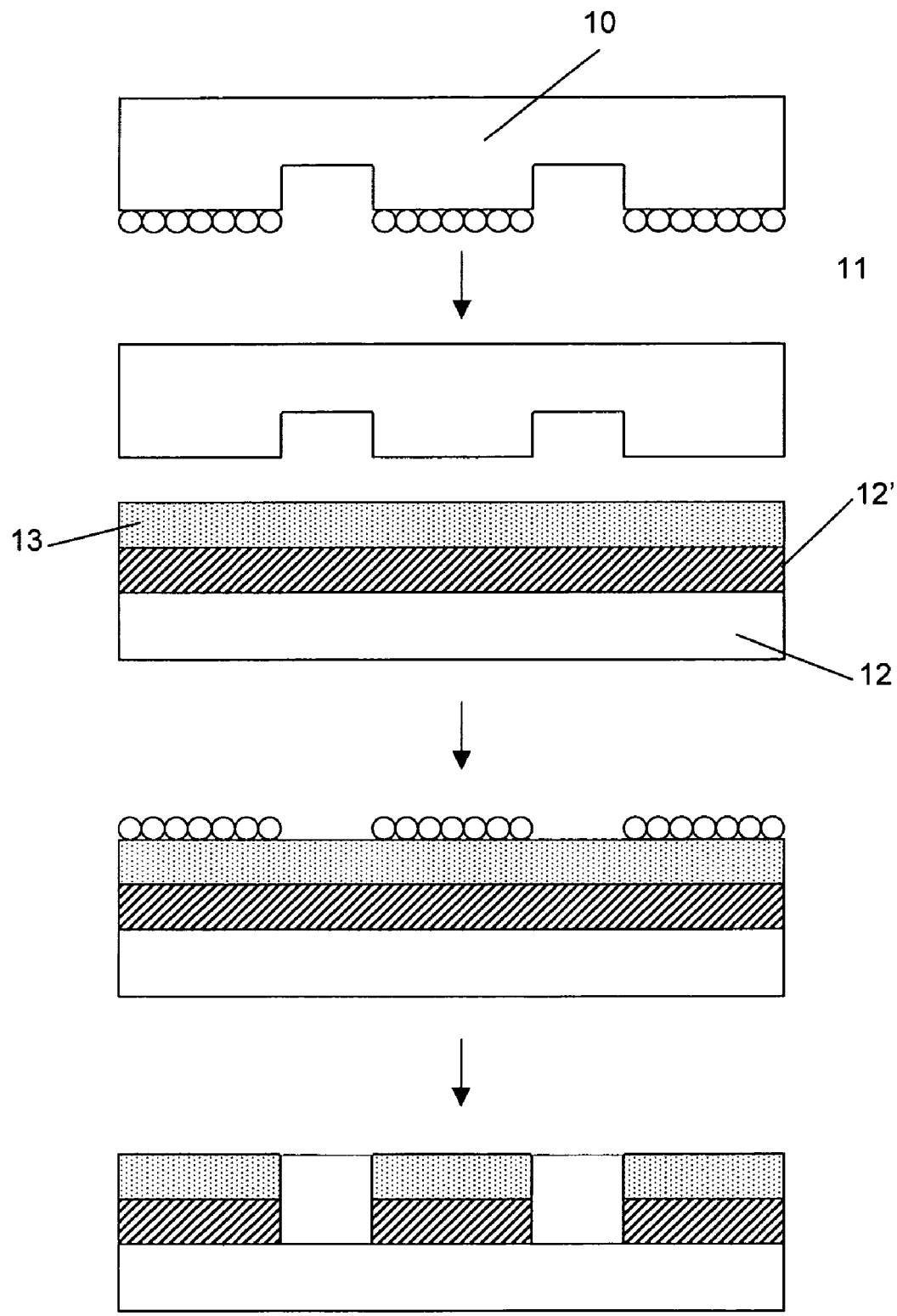
FIGS. 1a-1c schematically illustrate examples of conventional soft, hot and UV lithography process respectively.
Figure 1B:
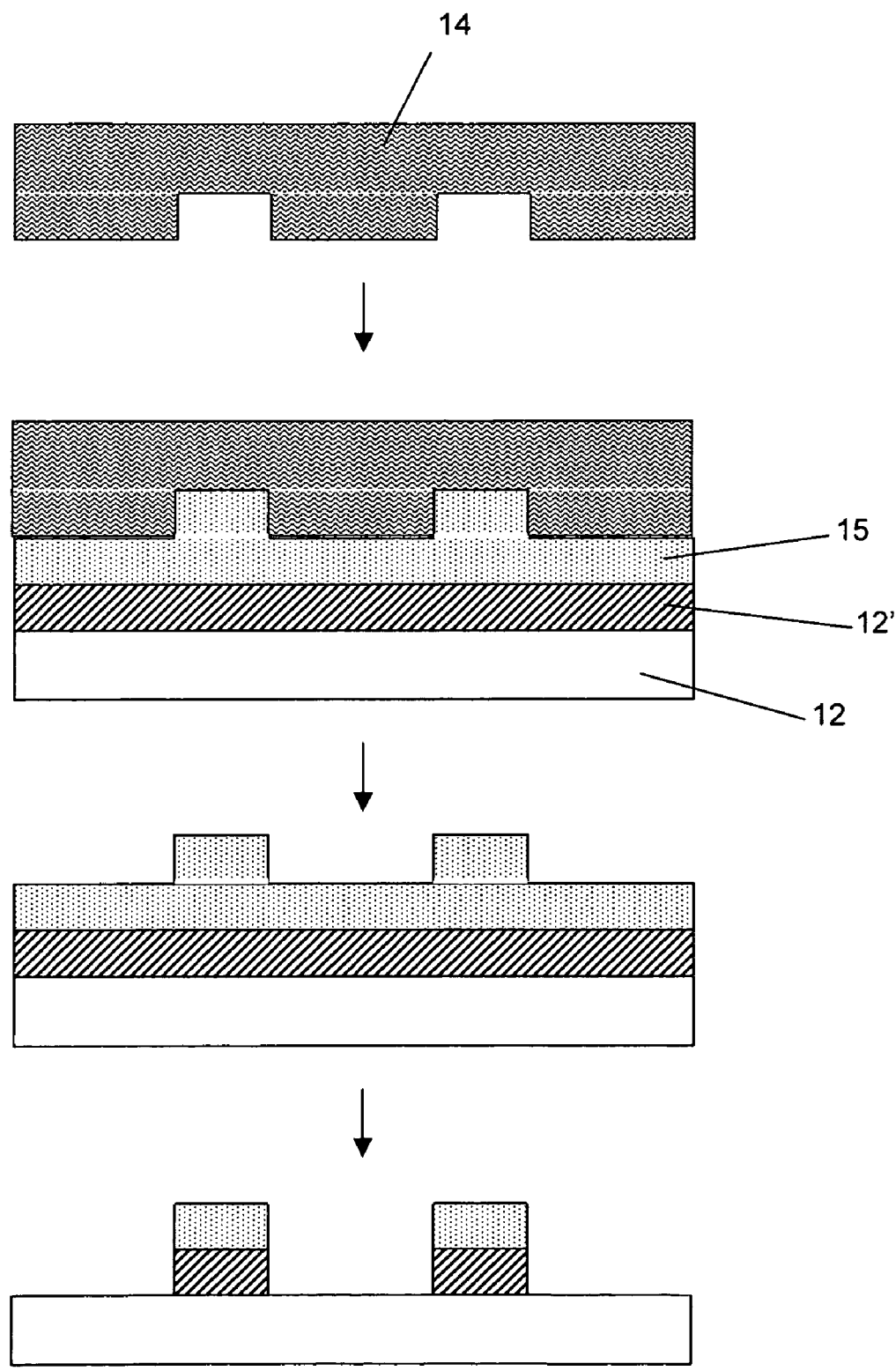
Figure 1C:
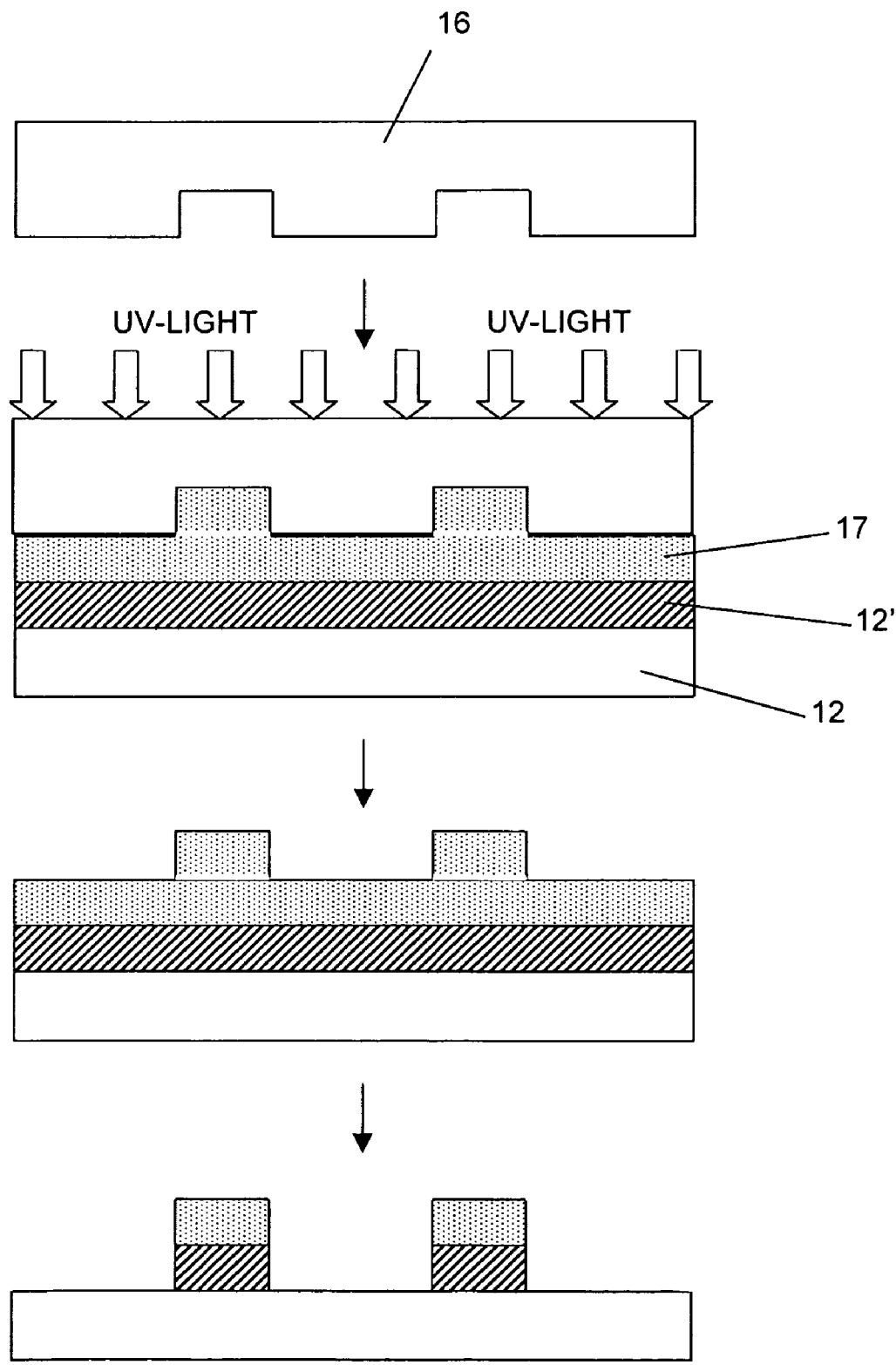

FIG. 1a schematically depicts the soft lithography process which involves transferring a layer of molecules 11 (typically an ink such as a thiol) from a flexible template 10 (typically fabricated from polydimethylsiloxane (PDMS)) onto a resist layer 13 which is supported upon a substrate 12 and planarization and transfer layer 12'. The template 10 has a pattern of features on its surface, the molecular layer being disposed upon the features. When the template is pressed against the resist layer, the layer of molecules 11 stick to the resist. Upon removal of the template from the resist, the layer of molecules 11 stick to the resist, the residual layer of resist is etched such that the areas of the resist not covered by the transferred molecular layer are etched down to the substrate.

The template used in soft lithography may be easily deformed and may therefore not be suited to high resolution applications, e.g. on a nanometer scale, since the deformation of the template may adversely affect the imprinted pattern. Furthermore, when fabricating multiple layer structures, in which the same region will be overlaid multiple times, soft imprint lithography may not provide overlay accuracy on a nanometer scale.

Hot imprint lithography (or hot embossing) is also known as nanoimprint lithography (NIL) when used on a nanometer scale. The process uses a harder template made from, for example, silicon or nickel, which are more resistant to wear and deformation. This is described for instance in U.S. Pat. No. 6,482,742 and illustrated in FIG. 1b. In a typical hot imprint process, a solid template 14 is imprinted into a thermosetting or a thermoplastic polymer resin 15, which has been cast on the surface of substrate. The resin may, for instance, be spin coated and baked onto the substrate surface or more typically (as in the example illustrated) onto a planarization and transfer layer 12'. It should be understood that the term "hard" when describing an imprint template includes materials which may generally be considered between "hard" and "soft" materials, such as for example "hard" rubber. The suitability of a particular material for use as an imprint template is determined by its application requirements.

When a thermosetting polymer resin is used, the resin is heated to a temperature such that, upon contact with the template, the resin is sufficiently flowable to flow into the pattern features defined on the template. The temperature of the resin is then increased to thermally cure (e.g. crosslink) the resin so that it solidifies and irreversibly adopts the desired pattern. The template may then be removed and the patterned resin cooled.

Examples of thermoplastic polymer resins used in hot imprint lithography processes are poly (methyl methacrylate), polystyrene, poly (benzyl methacrylate) or poly (cyclohexyl methacrylate). The thermoplastic resin is heated so that it is in a freely flowable state immediately prior to imprinting with the template. It is typically necessary to heat thermoplastic resin to a temperature considerably above the glass transition temperature of the resin. The template is pressed into the flowable resin and sufficient pressure is applied to ensure the resin flows into all the pattern features defined on the template. The resin is then cooled to below its glass transition temperature with the template in place whereupon the resin irreversibly adopts the desired pattern. The pattern will consist of the features in relief from a residual layer of the resin which may then be removed by an appropriate etch process to leave only the pattern features.

Figure 2:
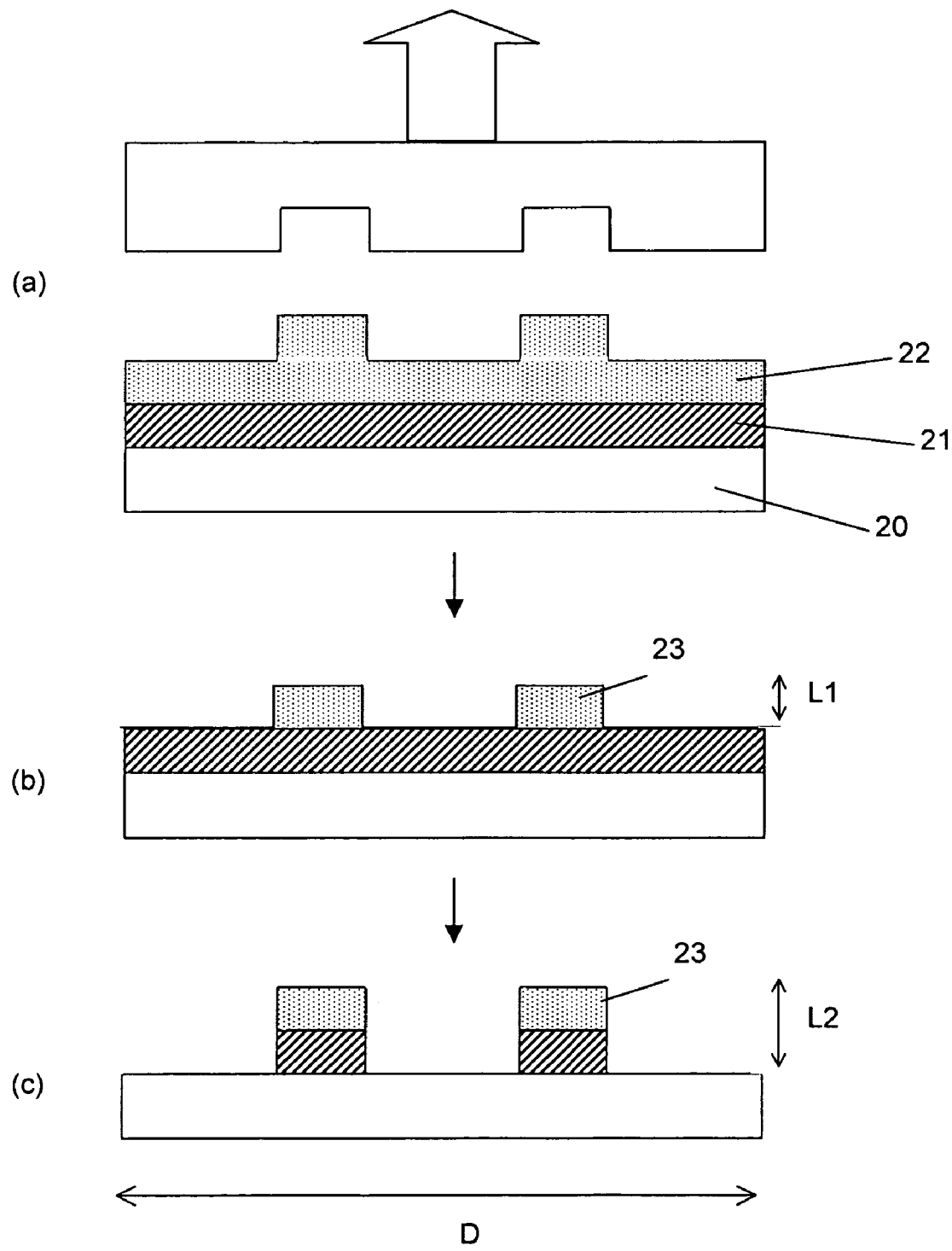
FIG. 2 schematically illustrates a two step etching process employed when hot and UV imprint lithography is used to pattern a resist layer.

Upon removal of the template from the solidified resin, a two-step etching process is typically performed as illustrated in FIGS. 2a to 2c. The substrate 20 has a planarization and transfer layer 21 immediately upon it, as shown in FIG. 2a. The purpose of the planarization and transfer layer is twofold. It acts to provide a surface substantially parallel to that of the template, which helps ensure that the contact between the template and the resin is parallel, and also to improve the aspect ratio of the printed features, as described herein.

After the template has been removed, a residual layer 22 of the solidified resin is left on the planarization and transfer layer 21, shaped in the desired pattern. The first etch is isotropic and removes parts of the residual layer 22, resulting in a poor aspect ratio of features where L1 is the height of the features 23, as shown in FIG. 2b. The second etch is anisotropic (or selective) and improves the aspect ratio. The anisotropic etch removes those parts of the planarization and transfer layer 21 which are not covered by the solidified resin, increasing the aspect ratio of the features 23 to (L2/D), as shown in FIG. 2c. The resulting polymer thickness contrast left on the substrate after etching can be used as for instance a mask for dry etching if the imprinted polymer is sufficiently resistant, for instance as a step in a lift-off process.

Hot imprint lithography suffers from a disadvantage in that not only must the pattern transfer be performed at a higher temperature, but also relatively large temperature differentials might be required in order to ensure the resin is adequately solidified before the template is removed. Temperature differentials between 35 and 100° C. may be needed. Differential thermal expansion between, for instance, the substrate and template may then lead to distortion in the transferred pattern. This may be exacerbated by the relatively high pressure required for the imprinting step, due the viscous nature of the imprintable material, which can induce mechanical deformation in the substrate, again distorting the pattern.

UV imprint lithography, on the other hand, does not involve such high temperatures and temperature changes nor does it require such viscous imprintable materials. Rather, UV imprint lithography involves the use of a partially or wholly transparent template and a UV-curable liquid, typically a monomer such as an acrylate or methacrylate. In general, any photopolymerizable material could be used, such as a mixture of monomers and an initiator. The curable liquid may also, for instance, include a dimethyl siloxane derivative. Such materials are less viscous than the thermosetting and thermoplastic resins used in hot imprint lithography and consequently move much faster to fill template pattern features. Low temperature and low pressure operation also favors higher throughput capabilities.

An example of a UV imprint process is illustrated in FIG. 1c. A quartz template 16 is applied to a UV curable resin 17 in a similar manner to the process of FIG. 1b. Instead of raising the temperature as in hot embossing employing thermosetting resins, or temperature cycling when using thermoplastic resins, UV radiation is applied to the resin through the quartz template in order to polymerize and thus cure it. Upon removal of the template, the remaining steps of etching the residual layer of resist are the same or similar as for the hot embossing process described herein. The UV curable resins typically used have a much lower viscosity than typical thermoplastic resins so that lower imprint pressures can be used. Reduced physical deformation due to the lower pressures, together with reduced deformation due to high temperatures and temperature changes, makes UV imprint lithography suited to applications requiring high overlay accuracy. In addition, the transparent nature of UV imprint templates can accommodate optical alignment techniques simultaneously to the imprinting.

Although this type of imprint lithography mainly uses UV curable materials, and is thus generically referred to as UV imprint lithography, other wavelengths of radiation may be used to cure appropriately selected materials (e.g., activate a polymerization or cross linking reaction). In general, any radiation capable of initiating such a chemical reaction may be used if an appropriate imprintable material is available. Alternative "activating radiation" may, for instance, include visible light, infrared radiation, x-ray radiation and electron beam radiation. In the general description herein, references to UV imprint lithography and use of UV radiation are not intended to exclude these and other activating radiation possibilities.

As an alternative to imprint systems using a planar template which is maintained substantially parallel to the substrate surface, roller imprint systems have been developed. Both hot and UV roller imprint systems have been proposed in which the template is formed on a roller but otherwise the imprint process is very similar to imprinting using a planar template. Unless the context requires otherwise, references to an imprint template include references to a roller template.

There is a particular development of UV imprint technology known as step and flash imprint lithography (SFIL) which may be used to pattern a substrate in small steps in a similar manner to optical steppers conventionally used, for example, in IC manufacture. This involves printing small areas of the substrate at a time by imprinting a template into a UV curable resin, 'flashing' UV radiation through the template to cure the resin beneath the template, removing the template, stepping to an adjacent region of the substrate and repeating the operation. The small field size of such step and repeat processes may help reduce pattern distortions and CD variations so that SFIL may be particularly suited to manufacture of IC and other devices requiring high overlay accuracy.

Although in principle the UV curable resin can be applied to the entire substrate surface, for instance by spin coating, this may be problematic due to the volatile nature of UV curable resins.

One approach to addressing this problem is the so-called 'drop on demand' process in which the resin is dispensed onto a target portion of the substrate in droplets immediately prior to imprinting with the template. The liquid dispensing is controlled so that a predetermined volume of liquid is deposited on a particular target portion of the substrate. The liquid may be dispensed in a variety of patterns and the combination of carefully controlling liquid volume and placement of the pattern can be employed to confine patterning to the target area.

Dispensing the resin on demand as mentioned is not a trivial matter. The size and spacing of the droplets are carefully controlled to ensure there is sufficient resin to fill template features while at the same time minimizing excess resin which can be rolled to an undesirably thick or uneven residual layer since as soon as neighboring drops touch the resin will have nowhere to flow.

Although reference is made herein to depositing UV curable liquids onto a substrate, the liquids could also be deposited on the template and in general the same techniques and considerations will apply.

Figure 3:
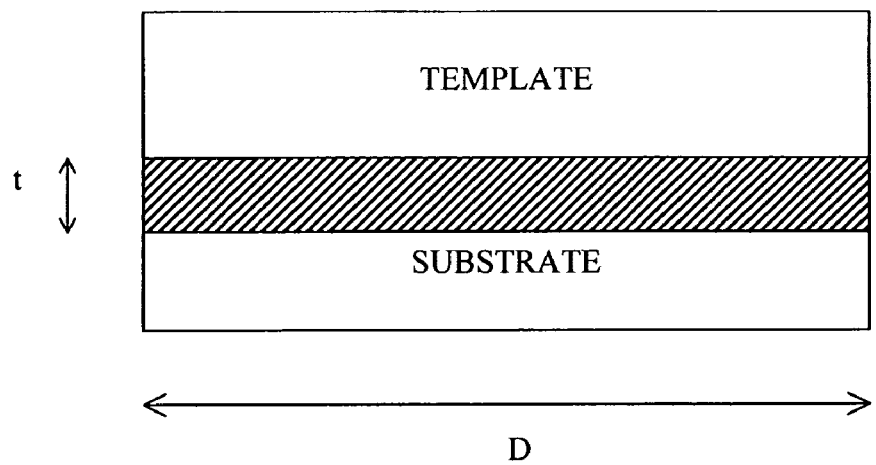
FIG. 3 schematically illustrates relative dimensions of template features compared to the thickness of a typical imprintable resist layer deposited on a substrate.

FIG. 3 illustrates the relative dimensions of the template, imprintable material (curable monomer, thermosetting resin, thermoplastic, etc) and substrate. The ratio of the width of the substrate, D, to the thickness of the curable resin layer, t, is of the order of $10^6$. It will be appreciated that, in order to avoid the features projecting from the template damaging the substrate, the dimension t should be greater than the depth of the projecting features on the template.

The residual layer left after stamping is useful in protecting the underlying substrate, but as mentioned herein it may also be the source of a problem, particularly when high resolution and/or overlay accuracy is required. The first 'breakthrough' etch is isotropic (non-selective) and will thus to some extent erode the features imprinted as well as the residual layer. This may be exacerbated if the residual layer is overly thick and/or uneven. This problem may, for instance, lead to variation in the thickness of lines ultimately formed in the underlying substrate (i.e. variation in the critical dimension). The uniformity of the thickness of a line that is etched in the transfer layer in the second anisotropic etch is dependant upon the aspect ratio and integrity of the shape of the feature left in the resin. If the residual resin layer is uneven, then the non-selective first etch can leave some of these features with "rounded" tops so that they are not sufficiently well defined to ensure good uniformity of line thickness in the second and any subsequent etch process. In principle, the above problem may be reduced by ensuring the residual layer is as thin as possible but this can require application of undesirably large pressures (possibly increasing substrate deformation) and relatively long imprinting times (possibly reducing throughput).

The template is a significant component of the imprint lithography system. As noted herein, the resolution of the features on the template surface is a limiting factor on the attainable resolution of features printed on the substrate. The templates used for hot and UV lithography are generally formed in a two-stage process. Initially, the required pattern is written using, for example, electron beam writing, to give a high resolution pattern in resist. The resist pattern is then transferred into a thin layer of chrome which forms the mask for the final, anisotropic etch step to transfer the pattern into the base material of the template. Other techniques such as for example ion-beam lithography, X-ray lithography, extreme UV lithography, epitaxial growth, thin film deposition, chemical etching, plasma etching, ion etching or ion milling could be used. Generally, a technique capable of very high resolution will be used as the template is effectively a 1× mask with the resolution of the transferred pattern being limited by the resolution of the pattern on the template.

The release characteristics of the template may also be a consideration. The template may, for instance, be treated with a surface treatment material to form a thin release layer on the template having a low surface energy (a thin release layer may also be deposited on the substrate).

Another consideration in the development of imprint lithography is the mechanical durability of the template. The template may be subjected to large forces during stamping of the resist, and in the case of hot lithography, may also be subjected to extremes of pressure and temperature. This may cause wearing of the template, and may adversely affect the shape of the pattern imprinted upon the substrate.

In hot imprint lithography, there is a potential advantage in using a template of the same or similar material to the substrate to be patterned in order to reduce differential thermal expansion between the two. In UV imprint lithography, the template is at least partially transparent to the activation radiation and accordingly quartz templates are used.

Although specific reference may be made in this text to the use of imprint lithography in the manufacture of ICs, it should be understood that imprint apparatus and methods described may have other applications, such as the manufacture of integrated optical systems, guidance and detection patterns for magnetic domain memories, hard disc magnetic media, flat panel displays, thin-film magnetic heads, etc.

While in the description herein, particular reference has been made to the use of imprint lithography to transfer a template pattern to a substrate via an imprintable resin effectively acting as a resist, in some circumstances the imprintable material may itself be a functional material, for instance having a functionally such as conductivity, optical linear or non-linear response, etc. For example, the functional material may form a conductive layer, a semi-conductive layer, a dielectric layer or a layer having another desirable mechanical, electrical or optical property. Some organic substances may also be appropriate functional materials. Such applications may be within the scope of the present invention.

An embodiment of the present invention addresses the application of an imprintable medium (e.g. a curable resin) to a substrate and can be applied to one or both of the hot embossing and photo curing methods as described above.

Figure 4:
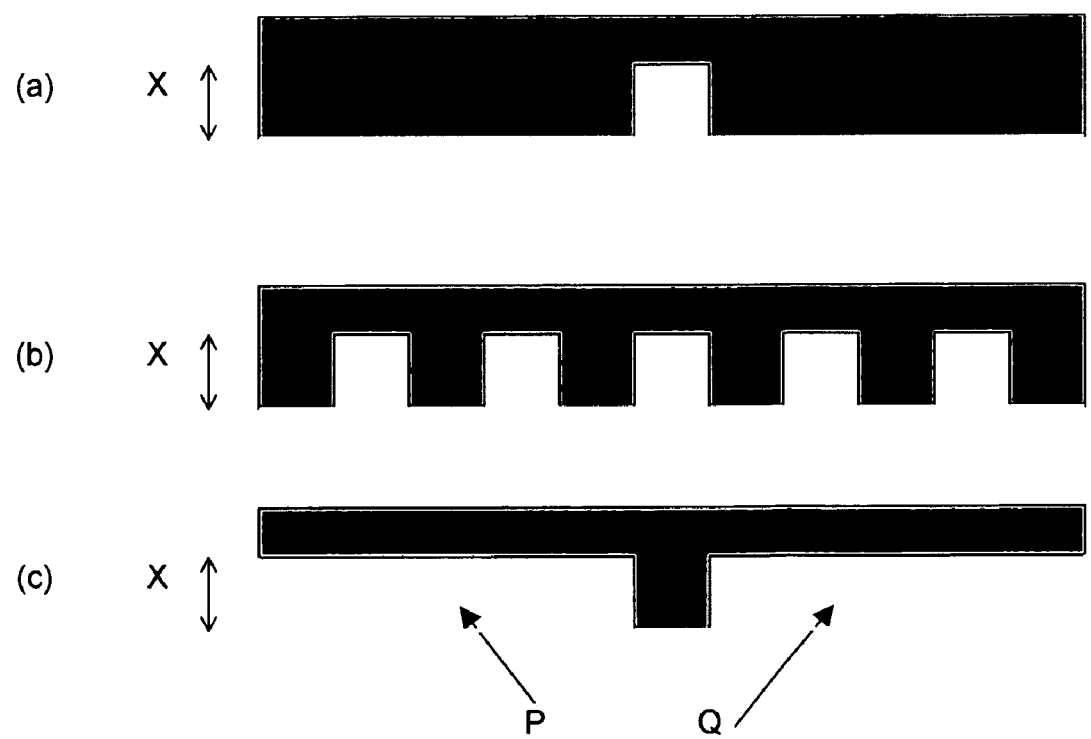
FIGS. 4a to 4c schematically illustrate templates having different patterns of features.

FIG. 4 illustrates various patterns on templates having different "pattern densities". If the "stamping region" of a template is defined as the volume formed by the contact area of the template and the depth of the protruding features, the pattern density can be considered as the fraction of the stamping region occupied by the imprintable medium when the template is impressed into it. The pattern density therefore takes a value between 0 and 1.

A pattern density of near zero, as shown in FIG. 4(a), indicates that a low proportion of the stamping region X of the template is filled. There is a single notch in the template, and only a small amount of imprintable medium is required to fill the gap(s) in the template. In this instance, it would therefore be preferable for there to be a small amount of imprintable medium (e.g., resin) on the substrate prior to stamping as a large amount of imprintable medium would be displaced when the template is impressed into the imprintable medium.

FIG. 4(b) shows a template structure with a pattern density of approximately 0.5, indicating that half of the stamping region X is to be filled with imprintable medium. This should be compared to FIG. 4(c) in which there is only one protrusion and the template structure has a pattern density of nearly 1 since the regions to be filled (P and Q) constitute almost all of the potential stamping region. Thus, pattern density values are an indication of the relative amounts of imprintable medium required to fill the stamping region.

Figure 5:
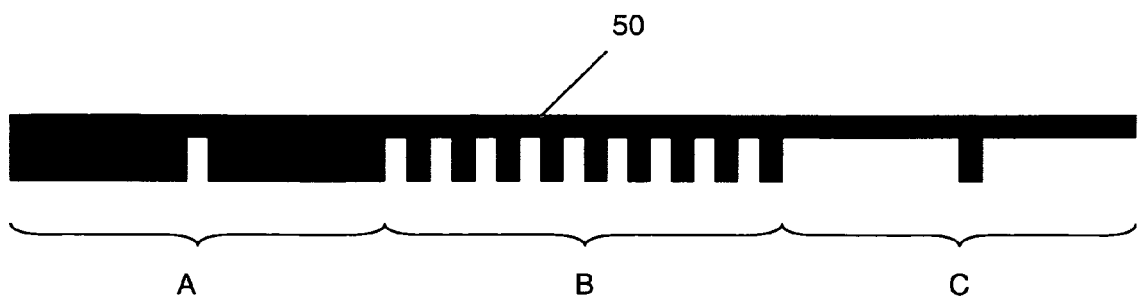
FIG. 5 schematically illustrates a template having three different regimes of feature patterns according to an embodiment of the invention.

FIG. 5 shows how a varying pattern density across a single template can be accommodated. A template 50 has a plurality of protrusions that constitute the pattern to be imprinted into the imprintable medium. The pattern can be divided into three regions, A, B and C, which have pattern densities of near zero, about 0.5 and nearly 1, respectively. In this example, it is desirable for there to be more imprintable medium on the area of the substrate beneath region C of the template because more imprintable medium is required to fill the stamping region. However, application of metered droplets and/or spin coating of the imprintable medium may not provide the accuracy required to distribute varying levels of imprintable medium across the face of the template.

According to an embodiment of the invention, contact between the imprintable medium and the patterning template is preceded by contact of the imprintable medium with a distributing stamp which spreads out the imprintable medium on the surface of the substrate in accordance with the pattern on the patterning template.

The patterning template will most likely not have a uniform pattern density across its contact face. The pattern density will vary, with some regions having closely packed features and others having relatively few features. The pattern to be imprinted may have clearly defined regions which have a uniform pattern density within each region, as in the case of the template of FIG. 5. Alternatively, it may be that the pattern to be imprinted can only be divided into regions which have a varying pattern density within each region, but each region has a different average pattern density to adjacent regions.

The average pattern density for a given region is directly related to the amount of imprintable medium required to form the desired pattern. For regions of low pattern density, the fraction of the stamping region occupied by the imprintable medium is low, and therefore little imprintable medium is required on the substrate. Similarly, for regions having a high pattern density, a greater amount of imprintable medium is required to form the desired pattern features. The distributing first stamp is therefore designed with a similar pattern density to that of the template, but without the fine structure of the pattern to be imprinted. The first stamp can be considered as a "rough" version of the patterned template whose purpose is to prepare the distribution of imprintable medium on the substrate. The preliminary redistribution can reduce excess imprintable medium being left over, and enable reduction of the stamping force required to imprint the desired pattern since there is less imprintable medium to stamp through in regions of low pattern density.

Figure 6:
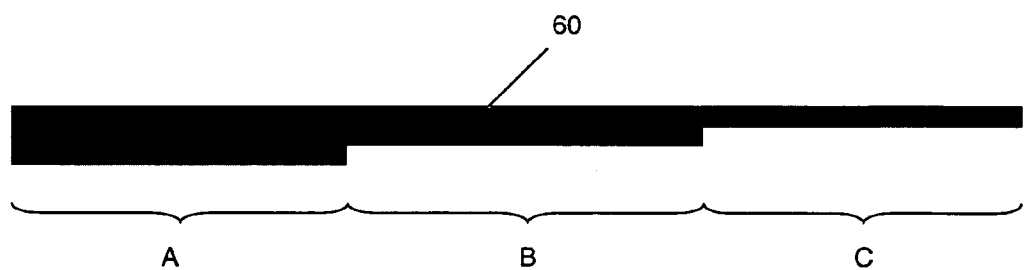
FIG. 6 schematically illustrates a multi-layer pre-stamp for use with the template of FIG. 5 in accordance with an embodiment of the invention.

FIG. 6 illustrates a potential distributing first stamp 60 for use with the template 50 of FIG. 5. The stamp 60 has a varying thickness so that when applied to the imprintable medium, the medium will flow to the region having least resistance, i.e. to the right hand side, corresponding to region C of FIG. 5, the region requiring the most imprintable medium to effect the desired pattern.

Figure 7:
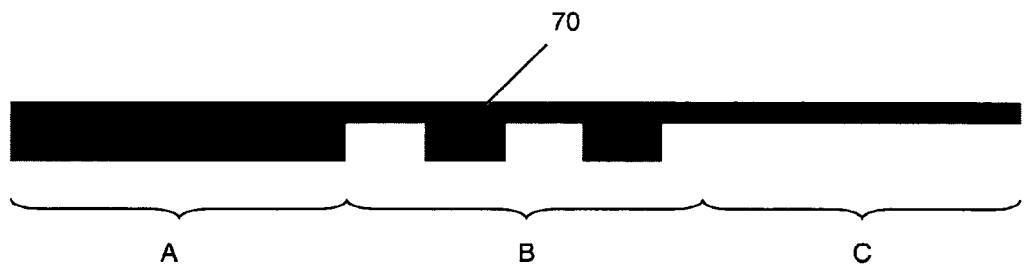
FIG. 7 schematically illustrates a binary pre-stamp for use with the template of FIG. 5 in accordance with an embodiment of the invention.

FIG. 7 illustrates an alternative distributing first stamp 70 for use with the template 50 of FIG. 5. In this case, the stamp 70 is a binary stamp, in that the distributing pattern is either "on" or "off". The appropriate pattern density is provided by a suitable arrangement of equal height projections defined by the stamp 70 rather than by flat layers of varying thickness. The effect of applying the stamp 70 will be substantially the same as the effect of the stamp 60 of FIG. 6, but stamp 70 may be easier to manufacture than stamp 60 because it does not require preparation of layers of different height on the surface of the stamp 70.

An embodiment of a lithography apparatus therefore incorporates two stamps which complement one another. The first stamp is applied with a relatively high force and is designed to redistribute the imprintable medium appropriately for the pattern of the second stamp. The second stamp is the template that bears the actual pattern to be printed, as with known imprint systems. The first stamp distributes the imprintable medium in accordance with the pattern density of the template.

The application of imprintable medium by metered droplets or spin coating to the substrate may be time-consuming because of the time needed to squeeze out the drops with acceptable force, and this step may become a bottleneck in terms of increasing production throughput.

Figure 8:
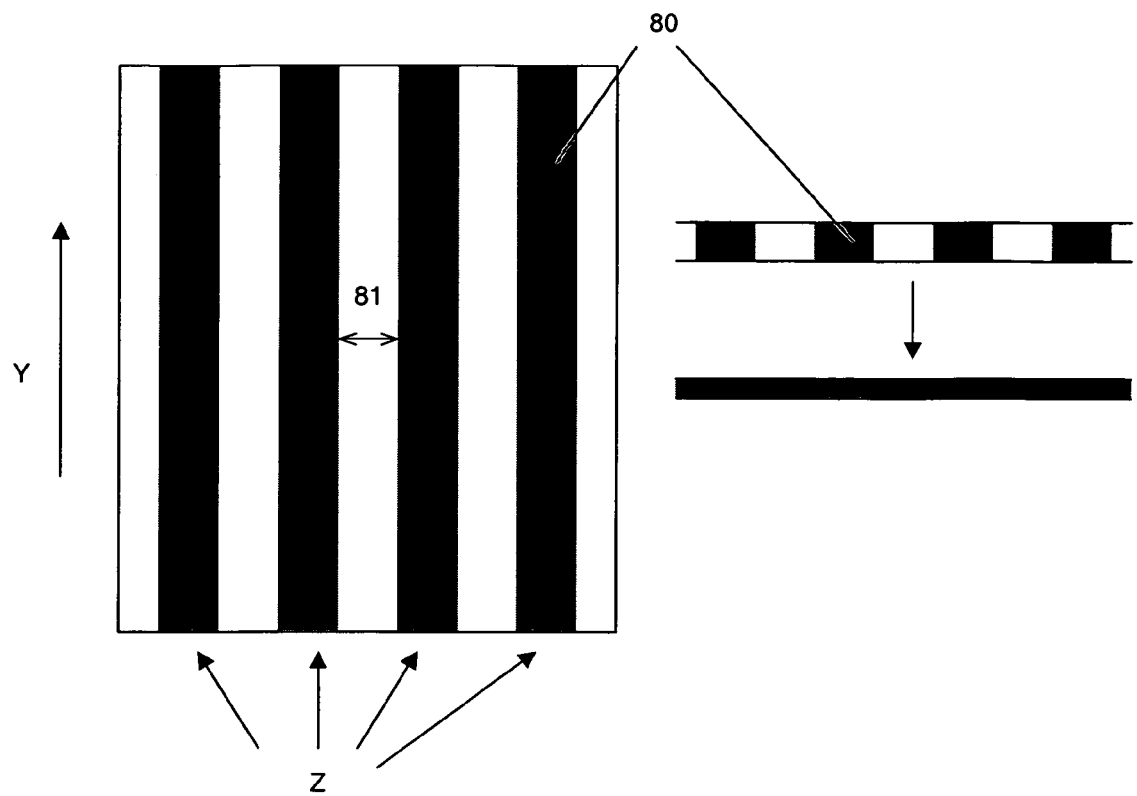
FIG. 8 schematically illustrates application of resin to a substrate in accordance with an embodiment of the invention.

An embodiment illustrated in FIG. 8 enables a decrease in "squeezing time" and improves the ease with which the imprintable medium is dosed and applied, while still allowing for distribution in accordance with the pattern to be printed. The embodiment of FIG. 8 applies drops of the imprintable medium "upstream" of the template at points Z while the template is being applied to an area of the substrate. This avoids having to wait at each stamping location for the drops of resin to be applied.

Once curing at one location has finished and the template is removed, the template is moved in the direction of the arrow Y, causing the droplets to smear in the direction of motion, leaving trails of imprintable medium 80 on the surface. The image on the right of FIG. 8 shows the trails in cross-section before and after the stamping step. The inter-streak separation 81 can be varied in accordance with the pattern on the template, as described above, so as to apply imprintable medium in appropriate quantities over the area of the template.

The embodiment of FIG. 8 can be mounted upon a gas bearing device. This allows the distance between the template and the substrate surface to be reduced considerably without risking damage to either.

Figure 9:
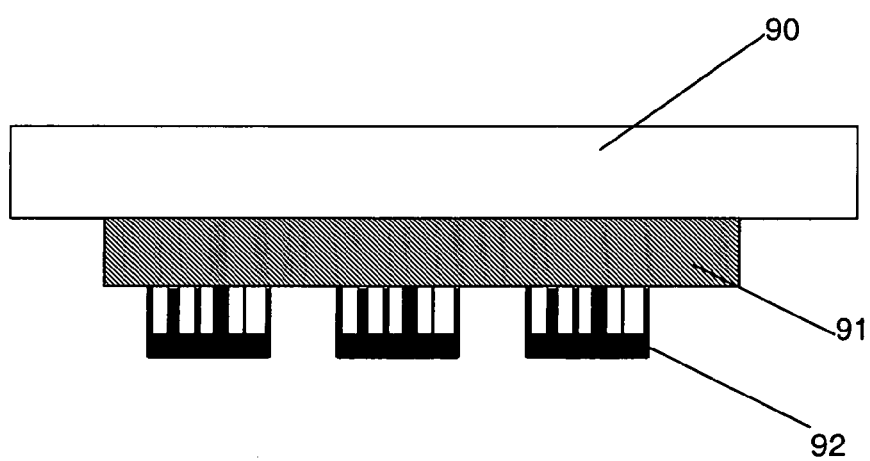
FIG. 9 schematically illustrates an arrangement of a substrate and a stamp for applying resin upside-down according to an embodiment of the invention.

An alternative way of addressing the problem addressed by the above embodiments is illustrated in FIG. 9. A substrate 90 and planarization and transfer layer 91 are supported (not shown) upside down. A template 92 is also turned upside down and filled with flowable imprintable medium. The filled template 92 is then held against the planarization and transfer layer and the imprintable medium is cured, for example, by UV radiation or via a temperature change (dependent on the type of imprintable medium used). When the imprintable medium has been cured, it will stick to the planarization and transfer layer 91, and the template 92 is removed. This process is repeated as necessary across the substrate.

The imprintable medium can be provided to the template 92 in a number of ways, including spraying and gravity delivery, to ensure a homogeneous distribution. In an embodiment, all parts of the template, especially the edges, are provided with the imprintable medium. This process may significantly reduce the force to be applied to the substrate during imprinting.

While specific embodiments of the invention have been described above, it will be appreciated that the invention may be practiced otherwise than as described. The description is not intended to limit the invention.

We claim:

1. An imprint apparatus, comprising:
    a substrate holder configured to hold a substrate having a volume of imprintable medium in a flowable state on a target portion of a surface of the substrate;
    a template holder configured to hold a template defining an imprint pattern having regions of different pattern density and to cause the template to imprint the medium with the pattern while the medium is in a flowable state and to separate from the medium while the medium is in a substantially non-flowable state;
    a redistribution device operable, prior to imprinting of the medium with the imprint pattern, to redistribute the volume of medium over the target portion into regions of differing volume corresponding to the regions of different pattern density of the imprint pattern; and
    a conditioning apparatus configured to subject the medium to conditions to change the medium from the flowable state into the substantially non-flowable state.

2. The apparatus of claim 1, wherein the redistribution device comprises a redistribution stamp.

3. The apparatus of claim 2, wherein the redistribution device is operable to impress the redistribution stamp into the medium in a direction which is substantially perpendicular to the substrate surface.

4. The apparatus of claim 2, wherein a pattern density of regions of the redistribution stamp corresponds to the pattern density of regions of the imprint pattern.

5. The apparatus of claim 1, wherein the redistribution device comprises the template.

6. The apparatus of claim 5, wherein the redistribution device is operable to cause the template to contact the medium and move the template across the target portion in a direction which is substantially parallel to the substrate surface.

7. The apparatus of claim 1, comprising a dosing apparatus configured to provide the volume of imprintable medium in a flowable state on the target portion of the surface of the substrate.

8. The apparatus of claim 1, wherein the apparatus is configured to impress the redistribution device into the medium with a greater force than the contact force between the template and the medium when imprinting the imprint pattern.

9. An imprint apparatus, comprising:
    a dosing apparatus configured to provide first and second volumes of an imprintable medium in a flowable state on respective adjacent first and second target portions of a surface of a substrate;
    a template holder configured to hold a template defining an imprint pattern having regions of different pattern density, to cause the template to imprint the first and second volumes of imprintable medium with the imprint pattern while the first and second volumes are in a flowable state, to cause the template to separate from the first volume while the first volume is in a substantially non-flowable state, and to cause the template, after imprinting of the first volume, to move to the second target portion such that the template contacts and redistributes the second volume of imprintable medium over the second target portion of the substrate surface prior to imprinting the second volume with the imprint pattern; and
    a conditioning apparatus configured to subject the first and second volumes of medium to conditions to change the first and second volumes of medium from the flowable state into the substantially non-flowable state.

10. The apparatus of claim 9, configured move the template across the second volume in a direction which is substantially parallel to the substrate surface to redistribute the second volume.

11. An imprint apparatus, comprising:
    a substrate holder configured to hold a substrate having a volume of imprintable medium in a flowable state on a target portion of a surface of the substrate;
    a template holder configured to hold a template defining an imprint pattern having regions of different pattern density, to cause the template to imprint the medium with the pattern while the medium is in the flowable state, and to cause the template to separate from the medium while the medium is in a substantially non-flowable state;

a smearing device configured to smear the imprintable medium beneath the template prior to imprinting the medium with the pattern; and a conditioning apparatus configured to subject the medium to conditions to change the medium from the flowable state into the substantially non-flowable state.

12. The apparatus of claim 11, comprising a dosing apparatus configured to provide the volume of imprintable medium in the flowable state on the target portion of the surface of the substrate.

13. The apparatus of claim 11, wherein the smearing device comprises the template.

14. The apparatus of claim 13, wherein the smearing device is operable to cause the template to contact the medium and move the template across the target portion in a direction which is substantially parallel to the substrate surface.

15. An imprint apparatus, comprising:

a template holder configured to hold a template defining an imprint pattern and to cause the template to imprint a volume of flowable imprintable medium on a target portion of a surface of the substrate with the pattern;

a redistribution device operable, prior to imprinting of the medium with the imprint pattern, to contact and redistribute the volume of flowable imprintable medium over the target portion; and a conditioning apparatus configured to subject the medium to conditions to change the medium from the flowable state into the substantially non-flowable state after or during imprinting of the medium with the imprint pattern.

16. The apparatus of claim 15, wherein the redistribution device is operable to impress a redistribution stamp into the medium in a direction which is substantially perpendicular to the substrate surface.

17. The apparatus of claim 15, wherein the redistribution device comprises a redistribution stamp and a pattern density of regions of the redistribution stamp corresponds to the pattern density of regions of the imprint pattern.

18. The apparatus of claim 17, wherein the redistribution device is operable to cause the template to contact the medium and move the template across the target portion in a direction which is substantially parallel to the substrate surface.

19. The apparatus of claim 15, wherein the redistribution device comprises the template.

20. The apparatus of claim 15, wherein the apparatus is configured to impress the redistribution device into the medium with a greater force than the contact force between the template and the medium when imprinting the imprint pattern.

* * * * *